United States Patent [19]
Buchholtz et al.

[11] Patent Number: 5,355,030
[45] Date of Patent: Oct. 11, 1994

[54] LOW VOLTAGE BICMOS LOGIC SWITCHING CIRCUIT

[75] Inventors: Timothy C. Buchholtz; Nghia Van Phan; Michael J. Rohn, all of Rochester, Minn.

[73] Assignee: International Business Machines Corporation, Armonk, N.Y.

[21] Appl. No.: 985,990

[22] Filed: Dec. 4, 1992

[51] Int. Cl.$^5$ .............. H03K 19/082; H03K 19/0948
[52] U.S. Cl. ..................................... 307/446; 307/443
[58] Field of Search ................ 307/446, 443, 570, 568

[56] References Cited

U.S. PATENT DOCUMENTS

| | | | |
|---|---|---|---|
| 4,719,373 | 1/1988 | Masuda et al. | 307/446 |
| 4,746,817 | 5/1988 | Banker et al. | 307/446 |
| 4,804,869 | 2/1989 | Masuda et al. | 307/446 |
| 4,845,385 | 7/1989 | Ruth, Jr. | 307/446 |
| 4,985,645 | 1/1991 | Tsutsui | 307/446 |
| 5,010,257 | 4/1991 | Boudon et al. | 307/446 |
| 5,034,628 | 7/1991 | Matsuzawa et al. | 307/446 |
| 5,053,644 | 10/1991 | Shibata et al. | 307/446 |
| 5,057,713 | 10/1991 | Iwamura et al. | 307/446 |
| 5,059,821 | 10/1991 | Murabayashi et al. | 307/360 |
| 5,065,048 | 11/1991 | Asai et al. | 307/443 |
| 5,077,492 | 12/1991 | Fuse et al. | 307/446 |
| 5,105,103 | 4/1992 | Neu | 307/570 |
| 5,146,120 | 9/1992 | Kimura et al. | 307/570 |
| 5,166,552 | 11/1992 | Aipperspach et al. | 307/446 |

Primary Examiner—Edward P. Westin
Assistant Examiner—Jon Santamauro
Attorney, Agent, or Firm—J. Michael Anglin; Duke W. Yee; Andrew J. Dillon

[57] ABSTRACT

The present invention involves a BICMOS logic switching circuit biased between upper and lower supply voltages. This circuit includes a CMOS logic circuit driven by a plurality of logic input signals. This logic switching circuit also has a driving circuit coupled to the CMOS logic switching circuit and includes an output node, a first bipolar transistor, and a second bipolar transistor. The first bipolar transistor is coupled in series with the second bipolar transistor with the output node therebetween for providing an output signal on the output node, wherein the second bipolar transistor has a base directly coupled to a field effect transistor switch coupled to the upper supply voltage. The field effect transistor switch is controlled by logic input signals. The circuit also includes a switching circuit coupled to the upper supply voltage, the lower supply voltage, and the output node for causing the output signal on the output node to swing fully between the upper and the lower supply voltages in response to changes in the logic input signals.

15 Claims, 7 Drawing Sheets

LOW VOLTAGE BICMOS LOGIC SWITCHING CIRCUIT

BACKGROUND OF THE INVENTION

1. Technical Field

The present invention relates in general to a logic switching circuit and in particular to a logic switching circuit providing an output waveform that switches between a lower rail voltage and an upper rail voltage. Still more particularly, the present invention relates to an improved logic switching circuit that provides an output waveform that switches quickly between a lower rail voltage and an upper rail voltage at low power supply voltages.

2. Description of the Related Art

A very large scale integration (VLSI) circuit of high performance having the advantages of both bipolar and metal oxide semiconductor (MOS) technologies may be realized by forming a bipolar transistor and a MOS transistor over a common semiconductor substrate and by placing these transistors in a circuit to form a so-called bipolar complementary metal oxide semiconductor (BICMOS). Typical BICMOS logic switching circuits include two different stages. The first stage includes CMOS field effect transistors (FETs) to achieve the desired logic function, while the second stage usually includes at least one bipolar transistor to operate as the driving stage of the logic switching circuit.

Bipolar transistors are known for their ability to supply higher currents than FETs under identical operating conditions. Additionally, bipolar transistors require less space and exhibit lower input capacitance than FETs. On the other hand, FETs are preferably utilized in the first stage of a BICMOS logic switching circuits to perform the desired logic function since FETs have superior integration density when low levels of power dissipation are required in the circuit. Moreover, FETs also provide better logic efficiency than the bipolar transistors.

Referring now to FIG. 1, a schematic diagram is depicted which illustrates a conventional prior art BICMOS logic switching circuit implementing a two input NAND function. In BICMOS logic switching circuit 100, transistors P1, P2, N1, N2, N3, and N4 provide the NAND logical function. Transistors P1 and P2 are p-channel FETs, while transistors N1, N2, N3, and N4 are n-channel FETs. Transistors T1 and T2 are NPN bipolar transistors that are connected in series with node 10 located between T1 and T2. Node 10 is the output node for this logic switching circuit.

Transistors P3, N5, P4, and N7 comprise the circuitry that provides a rail-to-rail output swing in the output of BICMOS logic switching circuit 100. A "rail-to-rail" output swing occurs when the output voltage shifts from a first voltage VDD to a second voltage GND or vice versa. Transistors P3 and P4 are p-channel FETs, while transistors N5 and N7 are n-channel FETs. Transistor N6 is an n-channel FET that ensures that T2 is off when T1 is on, allowing the output to shift from a first voltage GND to a second voltage VDD.

This conventional circuit provides a rail-to-rail output that switches quickly between the active bipolar region between a $V_{BE}$ from the lower rail to a $V_{BE}$ from the upper rail. The fact that the bipolar transistors, T1 and T2, do not remain in the active region throughout the entire rail-to-rail transition requires two small finishing FETs, P3 and N5, to complete the swing. These FETs also eliminate any potential DC power that would be dissipated by BICMOS logic switching circuits being driven by this circuit as a result of the output voltage swing of this circuit not being rail-to-rail.

The logic switching circuit depicted in FIG. 1 is adequate for operating voltages around 5 volts with a 1.0 micrometer BICMOS technology. For submicron technologies operating at supply voltages as low as 2.5 volts, however, this circuit topology becomes inadequate because the finishing FETs complete the rail-to-rail voltage swing too slowly. Submicron means less than 0.5 microns and submicron technologies include FET channel lengths less than 0.5 microns.

Therefore, it would be desirable to have a logic switching circuit topology that provides a quick rail-to-rail voltage response at low voltage levels.

SUMMARY OF THE INVENTION

It is therefore one object of the present invention to provide an improved BICMOS logic switching circuit.

It is another object of the present invention to provide a BICMOS logic switching circuit providing an output waveform that quickly switches between a lower rail voltage and an upper rail voltage.

It is yet another object of the present invention to provide a BICMOS logic switching circuit that provides an output waveform that switches quickly between the lower rail voltage and the upper rail voltage at low power supply voltages.

Another object of the present invention is to provide a BICMOS logic switching circuit capable of providing rapid rail-to-rail voltage output swings dissipation at lower power supply voltages, such as 2.5 volts.

The foregoing objects are achieved as is now described. The present invention discloses a BICMOS logic switching circuit biased between upper and lower supply voltages. The BICMOS logic switching circuit includes a CMOS logic circuit driven by a plurality of logic input signals. This BICMOS logic switching circuit also has a driving circuit coupled to the CMOS logic circuit and includes an output node, a first bipolar transistor, and a second bipolar transistor. The first bipolar transistor is coupled in series with the second bipolar transistor with the output node therebetween for providing an output signal on the output node, wherein the first bipolar transistor has a base directly coupled to a field effect transistor switch that is coupled to the upper supply voltage. The field effect transistor switch is controlled by logic input signals. The BICMOS logic switching circuit of the present invention also includes a switching circuit coupled to the upper supply voltage, the lower supply voltage, and the output node for causing the output signal on the output node to swing fully between the upper and the lower supply voltages in response to changes in the logic input signals.

The BICMOS logic switching circuit of the present invention also may include a clamping circuit coupled to the second bipolar transistor for clamping the second bipolar transistor, wherein the second bipolar transistor is held out of saturation. This clamping circuit may include a field effect transistor having a drain, a gate, and a source, wherein the drain and the drain of the field effect transistor are coupled to the base of the second bipolar transistor and the source of the field effect transistor is connected to the lower supply voltage.

The switching circuit in the present invention also may include a second driving circuit coupled to the output node and to a base of the first bipolar transistor. The second driving circuit causes the output signal on the output node to swing fully between the upper and the lower supply voltages. The switching circuit also may include a sensing circuit coupled to the output node, to the upper supply voltage, and to the lower supply voltage. The sensing circuit turns the driving circuit on and off in response to the output signal on the output node.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

The present invention provides rapid rail-to-rail output voltage swings without DC power dissipation in the circuit in response to logic inputs, while operating at power supply voltages lower than conventional circuits. The circuit of the present invention is intended to operate at voltages as low as about 2.5 volts.

Figure 2:
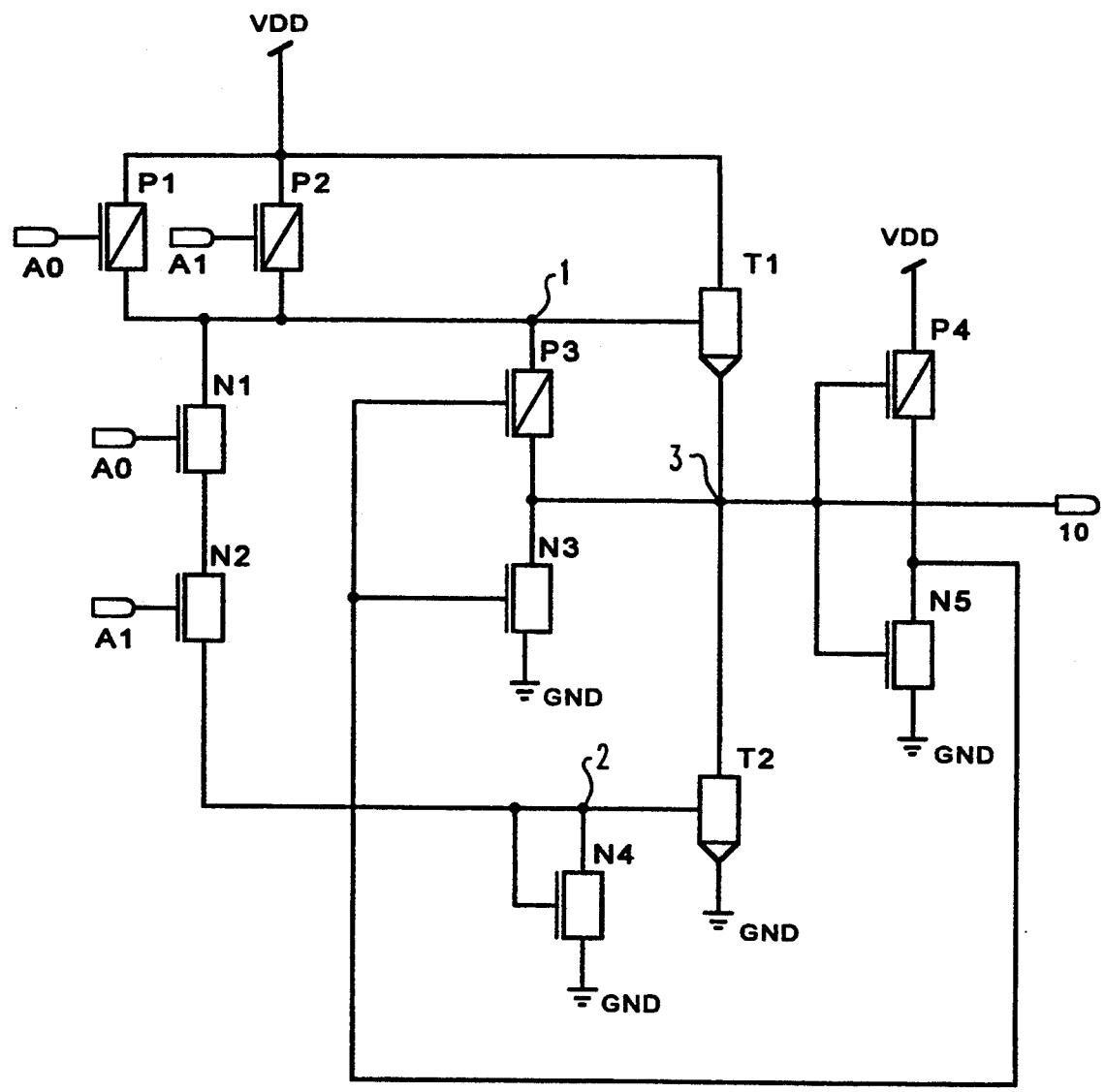
FIG. 2 is a schematic diagram of a two input BICMOS circuit implementing a logic NAND circuit in accordance with a preferred embodiment of the present invention.

With reference now to the figures and in particular with reference to FIG. 2, a schematic diagram of a two input BICMOS circuit is depicted implementing a logic NAND circuit in accordance with a preferred embodiment of the present invention. Transistors P1, P2, N1, and N2 form the 2-input NAND function of BICMOS circuit 200. Transistors P1 and P2 are p-channel FETs, while transistors N1 and N2 are n-channel FETs. Transistors T1 and T2 are NPN bipolar transistors connected together in a "totem pole" configuration with common node 3 connected to output node 10 in accordance with a preferred embodiment of the present invention. In the depicted schematic diagrams, common node 3 is shown as a separate point from output node 10, but in reality they are both the same node. Although T2 is a NPN bipolar transistor in the depicted embodiment, a PNP bipolar transistor also may be employed to form a push-pull type arrangement.

Transistors T1 and T2 are biased between a power supply voltage VDD and a ground voltage GND. Transistor T1 is configured in an emitter follower configuration, and transistor T2 is configured in a common emitter amplifier configuration. When transistor T1 is turned on and conducts current, the output signal at node 10 is pulled up to VDD. On the other hand, when transistor T2 is turned on and conducting current, the output signal at node 10 is pulled down to GND. Transistor N4, a n-channel FET, is employed to turn off transistor T2 when the output swings from a logic 1 to a logic 0.

The drain of transistor P4 and the drain of transistor N5 provide feedback for rail-to-rail voltage swings of the circuit to the gates of transistor P3, a p-channel FET, and transistor N3, a n-channel FET.

Figure 1:
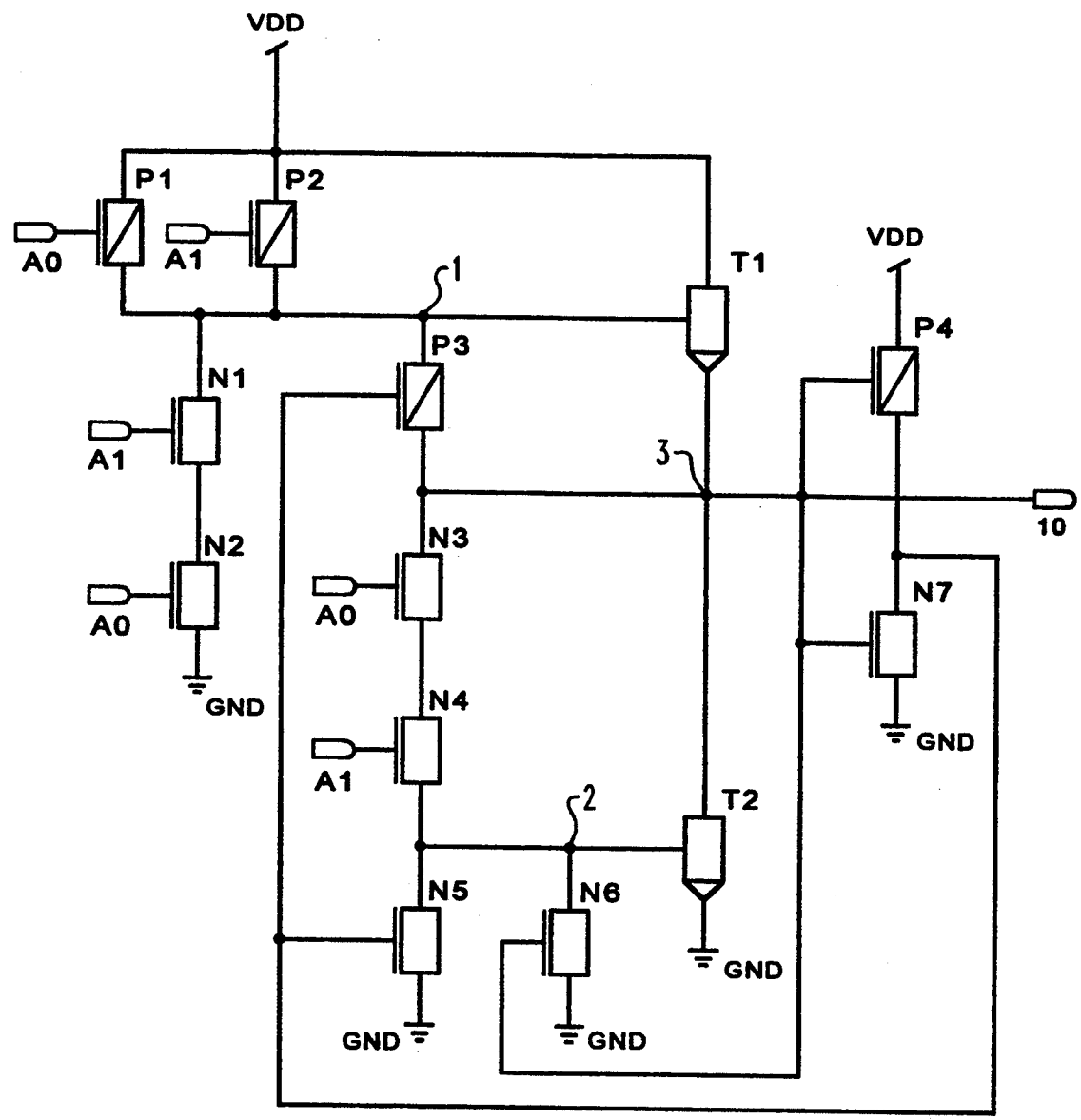
FIG. 1 depicts a schematic diagram of a conventional prior art BICMOS logic switching circuit implementing a two input NAND.

When both inputs A0 and A1 are at a logic level "1", transistors N1 and N2 turn on to provide a bias current into the base of transistor T1, which pulls the output smoothly to the lower rail voltage or GND without the $V_{BE}$ clamping behavior found in the prior art circuit, as depicted in FIG. 1. Transistor N4 turns off transistor T2, preventing it from saturating, and clamps the base of bipolar transistor T2 at the threshold voltage of transistor N4, $V_{t(N4)}$. In addition to the saturation prevention, transistor N4 turns off bipolar transistor T2 to make sure that bipolar transistor T2 is turned off when the output is high. Transistor N3 is utilized to eliminate AC switching noise.

When either A0 or A1 is at a logic 0 and the other input is at a logic 1, transistor P1 or P2, respectively, turns on and charges node 1 to VDD. In addition when both A0 and A1 are at a logic 0, transistors P1 and P2 are both turned on and charge node 1 to VDD. As the voltage at node 1 rises toward VDD, T1 begins to charge the output at node 10 towards the upper rail voltage or VDD. The feedback inverter formed by P4 and N5 drives P3, which brings the output to VDD and turns off T1.

Figure 3:
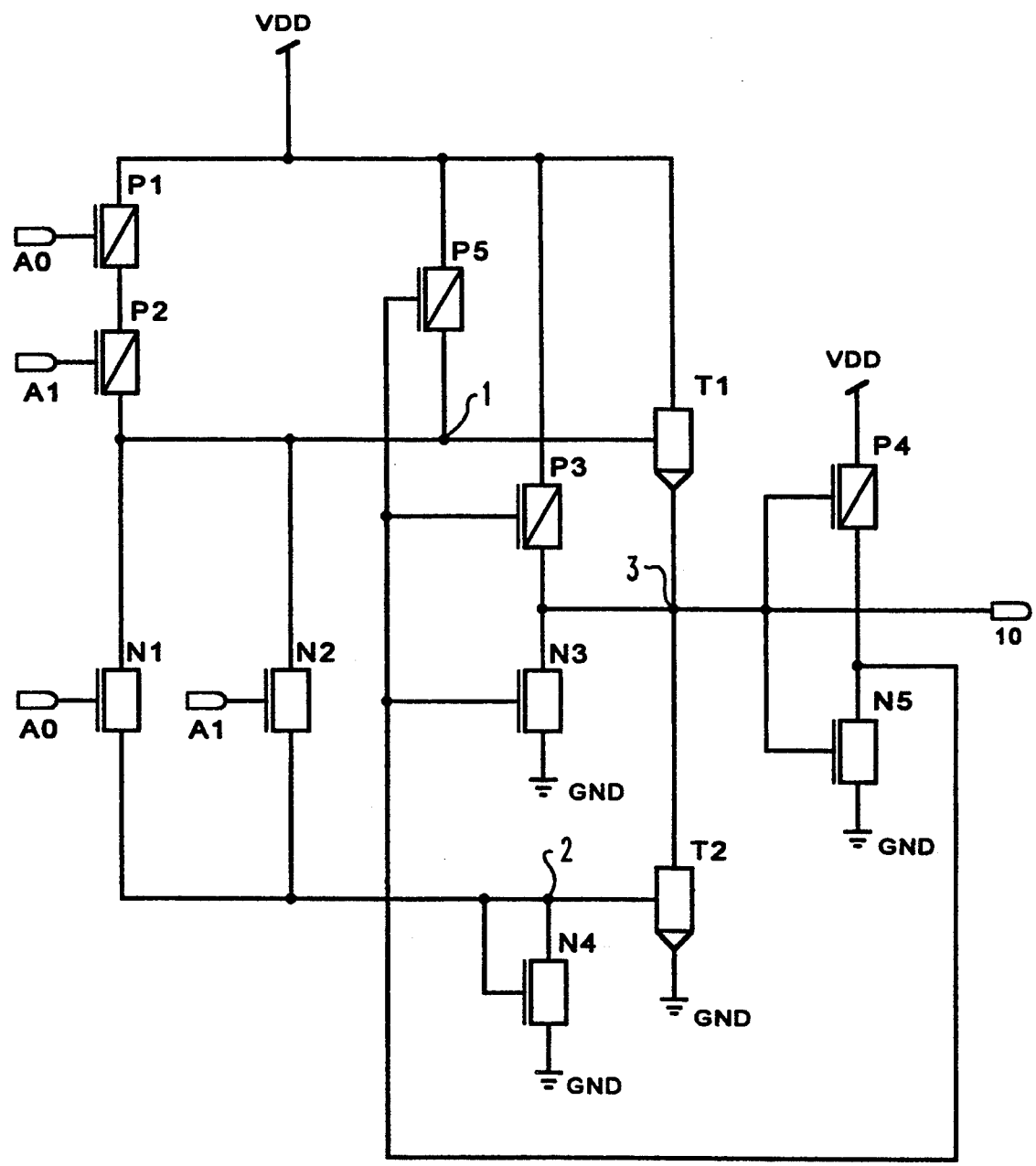
FIG. 3 depicts a schematic diagram of a two input BICMOS circuit implementing a logic NOR circuit in accordance with a preferred embodiment of the present invention.

Logic functions other than a NAND function also may be implemented in a BICMOS logic switching circuit in accordance with a preferred embodiment of the present invention. For example, FIG. 3 depicts a schematic diagram of a two input BICMOS circuit, implementing a logic NOR circuit in accordance with a preferred embodiment of the present invention. In FIG. 3, the logic function is provided by transistors P1, P2, N1, and N2.

Figure 4:
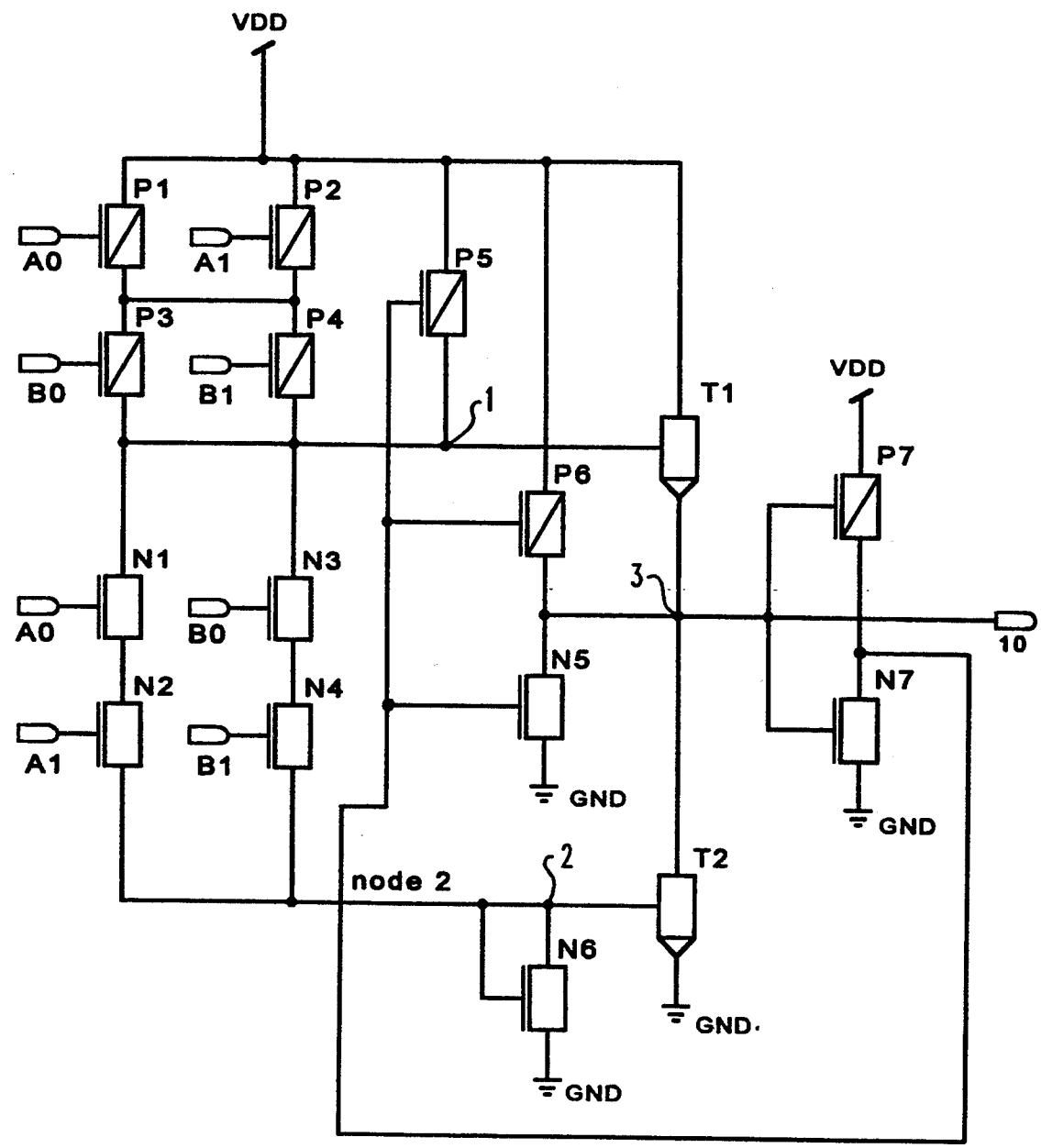
FIG. 4 is a schematic diagram of a two input BICMOS circuit implementing "AND-OR-INVERTER" logic in accordance with a preferred embodiment of the present invention.

Referring now to FIG. 4, a schematic diagram of a two input BICMOS circuit is depicted, which may be utilized to implement "AND-OR-INVERTER" logic in accordance with a preferred embodiment of the present invention. In this circuit, the logic functions are provided by transistors P1, P2, P3, P4, N1, N2, N3,and N4. Those skilled in the art will realize that many other logic functions may be implemented in accordance with a preferred embodiment of the present invention.

Figure 5:
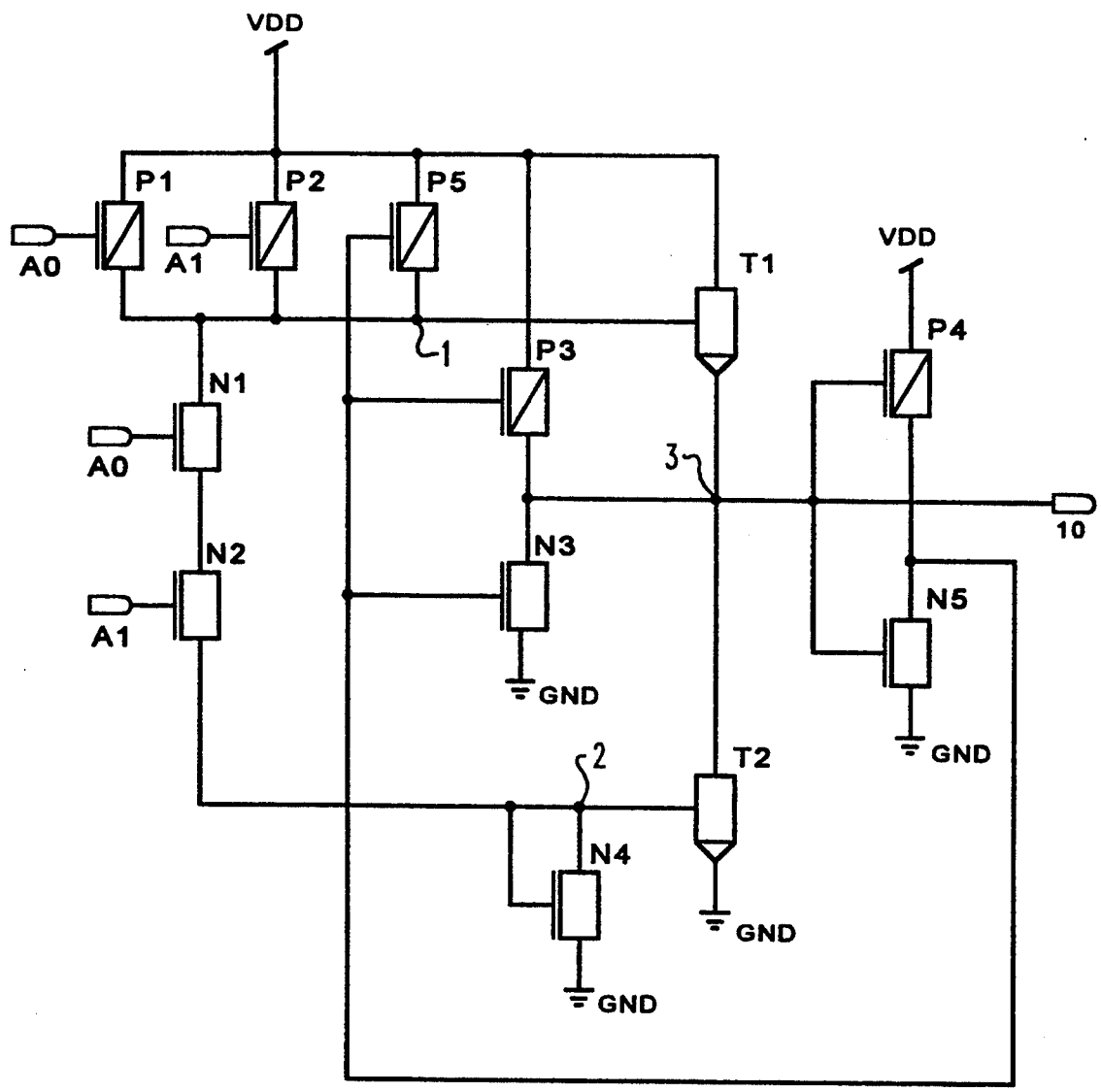
FIG. 5 depicts a schematic diagram of a two input BICMOS circuit implementing a logic NAND circuit enhanced for driving a heavy RC load in accordance with a preferred embodiment of the present invention.

When driving large RC loads, the BICMOS circuit depicted in FIG. 2 may be modified as illustrated in FIG. 5, which depicts a schematic diagram of a two input BICMOS circuit implementing a logic NAND circuit enhanced to drive a heavy RC load in accordance with a preferred embodiment of the present invention. Improvements in performance may be realized by coupling transistor P3 directly to VDD and adding P5, a p-channel FET, to increase the current to the base of the pull-down bipolar transistor T2.

The performance of the disclosed BICMOS circuits may be further enhanced by utilizing n-channel FETs with a lower threshold voltage (lower-$V_T$) for transistors N1 and N2. BICMOS circuits implementing these lower-$V_T$ n-channel FETs may improve the falling output delay of the BICMOS circuit up to 35% when operating at 2.5 volts over a circuit employing n-channel FETs with standard $V_T$'s.

Figure 6:
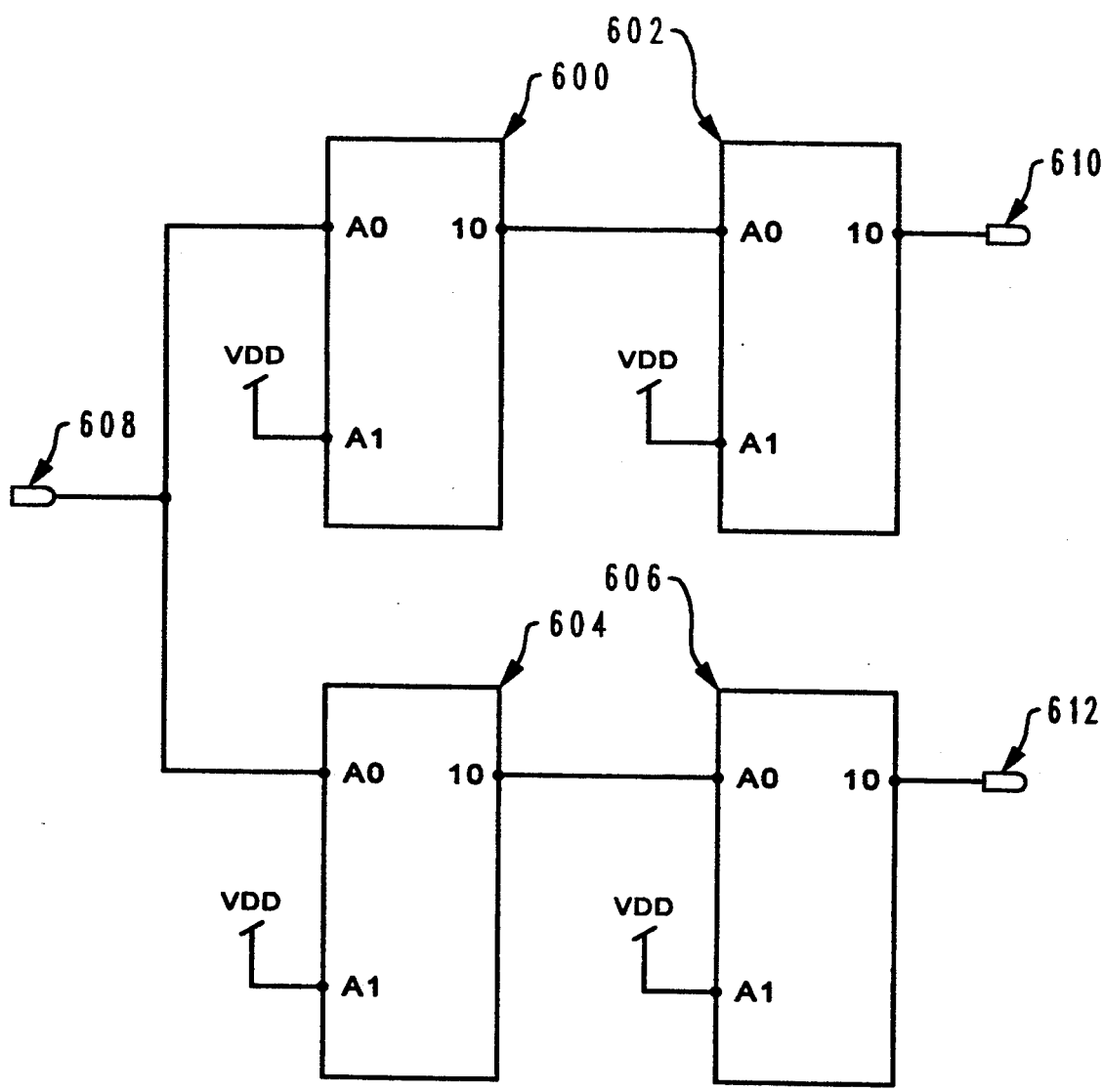
FIG. 6 is a block diagram of two BICMOS logic switching circuits implementing NAND functions.

Referring now to FIG. 6, a block diagram of two BICMOS logic switching circuits that may be utilized to implement NAND functions is illustrated. Logic blocks 600, 602, 604, and 606 are a BICMOS logic NAND circuits. Logic blocks 600 and 602 are BICMOS logic NAND circuits constructed in accordance with a preferred embodiment of the present invention while logic blocks 604 and 606 are conventional BICMOS logic NAND circuits.

Each logic block has two inputs, A0 and A1. Input A1 is tied to VDD in all four of the logic blocks. Input A0 in logic block 600 and logic block 604 are tied to input lead 608. Input lead 608 provides an input for a logic "1" or logic "0" signal. Output node 10 in logic block 600 is coupled to input A0 in logic block 602. Similarly, Output node 10 in logic block 604 is coupled to input A0 in logic block 606. Output node 10 in logic block 602 is coupled to output lead 610; output node 10 in logic block 606 is coupled to output lead 612.

Figure 7:
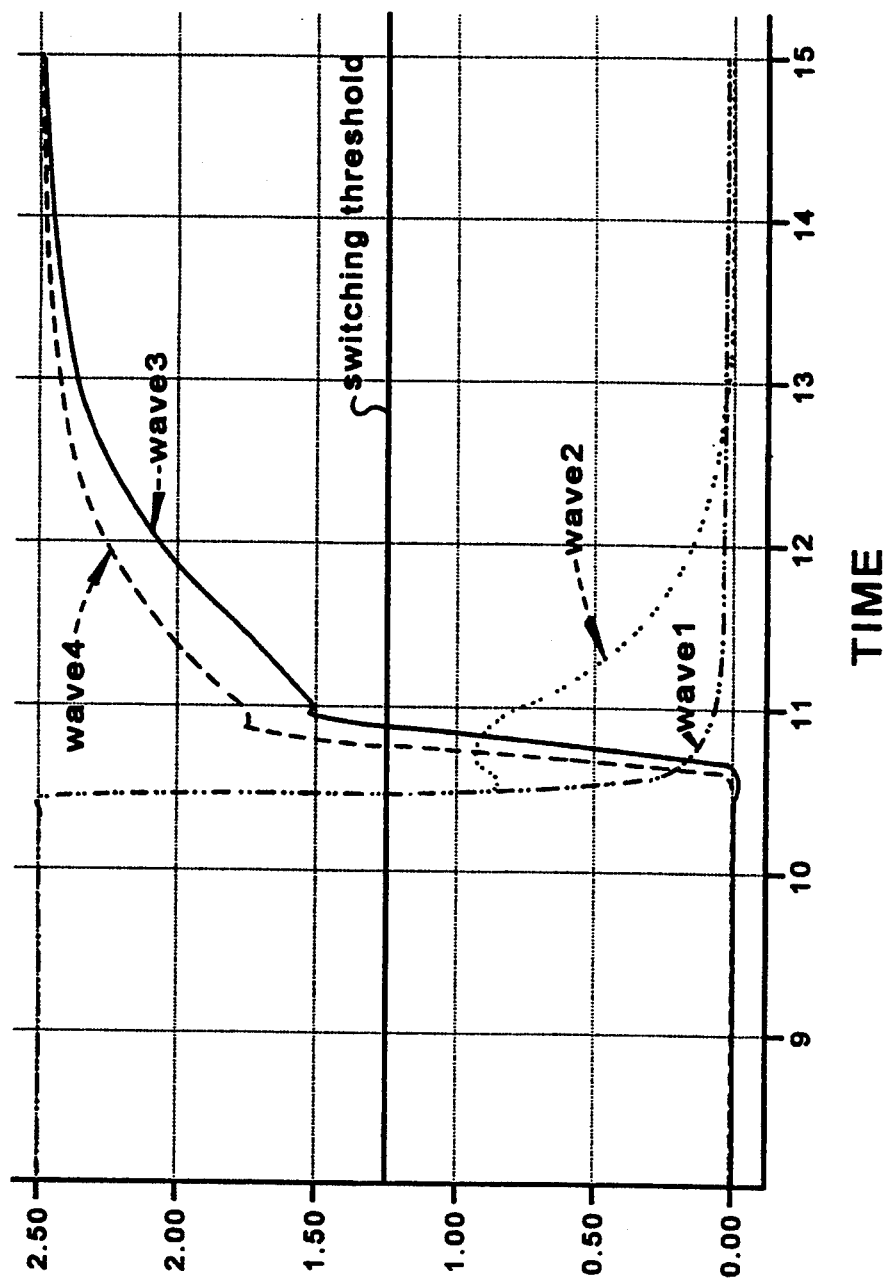
FIG. 7 depicts a graph of input and output waveforms of the conventional BICMOS logic switching circuit illustrated in FIG. 1 and the BICMOS logic switching circuit of the present invention depicted in FIG. 2 and implemented in a configuration as illustrated in FIG. 6.

With reference now to FIG. 7, there is illustrated a graph of input and output waveforms from the prior art BICMOS logic switching circuit illustrated in FIG. 1 and from the BICMOS logic switching circuit of the present invention depicted in FIG. 2 and implemented in a configuration as illustrated in FIG. 6. The waveforms in FIG. 7 are generated from a circuit simulation of both the conventional circuit and the circuit of the present invention. Wave 1 and wave 2 are output signals from logic blocks 600 and 604 respectively. These two output signals form the input signals into logic blocks 602 and 606 with wave 1 being sent into logic block 602, and wave 2 being sent into logic block 606. Wave 3 is an output signal occurring at output lead 612, while wave 4 is the output signal occurring at output lead 610.

Wave 3 is the output from the conventional the BICMOS logic switching circuit, logic block 606, resulting from the input illustrated by wave 2 from logic block 604; wave 4 is the output of the BICMOS logic switching circuit, logic block 602, implementing a preferred embodiment of the present invention. Wave 4 is produced in response to wave 1, originating from the output of logic block 600.

The prior art circuit exhibits a much slower response at 2.5 volts when the output switches from the upper rail voltage, VDD, to the lower rail voltage, GND, because the portion of the output waveform representing the active bipolar region for transistor T2 in FIG. 1 is reduced an additional 2.5 volts from when VDD was at 5.0 volts.

Wave 2 illustrates $V_{BE}$ clamping behavior in bipolar transistor T2 of FIG. 2 caused by the direct coupling of n-channel FET's, N3 and N4, between the output and the base of bipolar transistor T2. On the other hand, wave 1 depicts a smooth output falling transition to ground because of the elimination of the $V_{BE}$ clamping effect, which is provided by a BICMOS logic switching circuit constructed in accordance with a preferred embodiment of the present invention. A dramatic improvement in the switching speed of the rising waveform, wave 4, can be seen.

Additionally, from circuit simulations, the waveform region in wave 4, dominated by the upper FET, has been reduced by nearly 200 millivolts because of the additional overdrive provided by the falling waveform, wave 1. These combined improvements observed in the output waveforms resulting from a BICMOS circuit constructed in accordance with a preferred embodiment of the present invention may become more significant when driving nets with large RC.

The depicted examples illustrate BICMOS logic switching circuits implementing various logic functions such as NAND, NOR, and inverted AND OR. Those of ordinary skill in the art will realize that many other logic functions having rapid rail-to-rail output voltage swings may be implemented in accordance with a preferred embodiment of the present invention. Additionally, larger numbers of inputs other than A0 and A1 also may be employed in accordance with a preferred embodiment of the present invention.

While the invention has been particularly shown and described with reference to a preferred embodiment, it will be understood by those skilled in the art that various changes in form and detail may be made therein without departing from the spirit and scope of the invention.

What is claimed is:

1. A logic switching circuit biased between upper and lower supply voltages, comprising:
 a CMOS logic circuit driven by a plurality of logic input signals, wherein said CMOS logic circuit includes a plurality of controllable field effect transistor switches; a driving circuit coupled to said CMOS logic circuit, said driving circuit including:
 a first bipolar transistor;
 a second bipolar transistor coupled in series with said first bipolar transistor, said second bipolar transistor having a base;
 an output node disposed between said first bipolar transistor and said second bipolar transistor for providing an output signal; and
 at least one of said plurality of controllable field effect transistor switches coupling said base of said first bipolar transistor to said upper supply voltage, said at least one of said plurality of controllable field effect transistor switches switching in response to said plurality of logic input signals; and
 a switching circuit coupled to said upper supply voltage, to said lower supply voltage, and to said output node for causing said output signal on said output node to swing fully between said upper and said lower supply voltages in response to changes in said logic input signals, wherein said plurality of field effect transistor switches is absent from said switching circuit, wherein said switching circuit comprises:
 a second driving circuit coupled to said output node and to a base of said first bipolar transistor, wherein said second driving circuit causes said output signal on said output node to swing fully between said upper and said lower supply voltages, wherein said second driving circuit includes a first field effect transistor and a second field effect transistor, each field effect transistor having a drain, a gate, and a source, wherein said gate of said first field effect transistor and said gate of said second field effect transistor are coupled to a control node and said drain of said first field effect transistor and said drain of said second field effect transistor are connected to said output node; and a sensing circuit coupled to said output node, to said upper supply voltage, and to said lower supply voltage, wherein said sensing circuit turns said second driving circuit on and off in response to said output signal on said output node, wherein said sensing circuit comprises third and fourth field effect transistors, said third and fourth field effect transistors each including a drain, a gate, and a source, wherein said drain of said third field effect transistor and said drain of said fourth field effect transistor are coupled to said control node, said gates of said third and fourth field effect transistors are coupled to said output node, and said source of said third field effect transistor is coupled to said upper supply voltage and said source of said fourth field effect transistor is coupled to said lower supply voltage; and a fifth field effect transistor having a drain, a gate, and a source, wherein said source of said fifth field effect transistor is coupled to said upper supply voltage, said gate of said fifth field effect transistor is coupled to said control node, and said drain of said fifth field effect transistor is coupled to a base of said first bipolar transistor.

2. The logic switching circuit of claim 1 further comprising a clamping circuit coupled to said second bipolar transistor for clamping said second bipolar transistor, wherein said second bipolar transistor is held out of saturation.

3. The logic switching circuit of claim 1, wherein said first bipolar transistor and said second bipolar transistor are NPN bipolar transistors.

4. The logic switching circuit of claim 1, wherein said at least one field effect transistor switch is a p-channel field effect transistor.

5. The logic switching circuit of claim 1, wherein said CMOS logic switching circuit provides a NAND function.

6. The logic switching circuit of claim 1, wherein said CMOS logic circuit comprises a plurality of p-channel field effect transistors and n-channel field effect transistors.

7. The logic switching circuit of claim 2, wherein said clamping circuit comprises a field effect transistor having a drain, a gate, and a source, wherein said drain and said gate of said field effect transistor are coupled to said base of said second bipolar transistor and said source of said field effect transistor is connected to said lower supply voltage.

8. The logic switching circuit of claim 1, wherein said source of said first field effect transistor is directly coupled to said upper supply voltage.

9. The logic switching circuit of claim 1, wherein said third field effect transistor is a p-channel field effect transistor and fourth field effect transistor is a n-channel field effect transistor.

10. The logic switching circuit of claim 1, wherein said first field effect transistor is a p-channel field effect transistor and said second field effect transistor is a n-channel field effect transistor.

11. A BICMOS circuit biased between upper and lower supply voltages, comprising:

a CMOS logic circuit driven by a plurality of logic input signals, wherein said CMOS logic circuit includes a plurality of field effect transistors switches, said at least one of said plurality of field effect transistor switches being controlled by one of said plurality of logic input signals;

a driving circuit coupled to said CMOS logic circuit and including first and second bipolar transistors coupled in series with an output node therebetween for providing an output signal on said output node, wherein said first bipolar transistor has a base directly coupled to at least one of said plurality of field effect transistor switches that is coupled to said upper supply voltage; and a switching circuit coupled to said upper supply voltage, to said lower supply voltage, and to said output node for causing said output signal on said output node to swing fully between said upper and said lower supply voltages in response to changes in said logic input signals, wherein said switching circuit comprises:

a second driving circuit coupled to said output node and to a base of said first bipolar transistor, wherein said second driving circuit causes said output signal on said output node to swing fully between said upper and said lower supply voltages, wherein said second driving circuit includes a first field effect transistor and a second field effect transistor each field effect transistor having a drain, a gate, and a source, wherein said gate of said first field effect transistor and said gate of said second field effect transistor are coupled to a control node and said drain of said first field effect transistor and said drain of said second field effect transistor are connected to said output node, wherein said source of said first field effect transistor is directly coupled to said upper supply voltage; and a sensing circuit coupled to said output node, to said upper supply voltage, and to said lower supply voltage, wherein said sensing circuit turns said second driving circuit on and off in response to said output signal on said output node, wherein said sensing circuit includes third and fourth field effect transistors, said third and fourth field effect transistors each including a drain, a gate, and a source, wherein said drain of said third field effect transistor and said drain of said fourth field effect transistor are coupled to said control node, said gates of said third and fourth field effect transistors are coupled to said output node, and said source of said third field effect transistor is coupled to said upper supply voltage and said source of said fourth field effect transistor is coupled to said lower supply voltage; and a fifth field effect transistor having a drain, a gate, and a source, wherein said source of said fifth field effect transistor is coupled to said upper supply voltage, said gate of said fifth field effect transistor is coupled to said control node, and said drain of said fifth field effect transistor is coupled to a base of said first bipolar transistor.

12. The BICMOS circuit of claim 11 further comprising a clamping circuit coupled to said second bipolar transistor for clamping said second bipolar transistor.

13. The logic switching circuit of claim 12, wherein said clamping circuit comprises a field effect transistor having a drain, a gate, and a source, wherein said drain and said source of said field effect transistor are coupled to said base of said second bipolar transistor and said source of said field effect transistor is connected to said lower supply voltage.

14. The BICMOS circuit of claim 11, wherein said first bipolar transistor and said second bipolar transistor are NPN bipolar transistors.

15. The BICMOS circuit of claim 11, wherein said CMOS logic circuit provides a NAND function.

* * * * *